(12) United States Patent
Thurmond et al.

(10) Patent No.: US 11,188,133 B2
(45) Date of Patent: *Nov. 30, 2021

(54) SYSTEM FOR TRANSMITTING POWER TO A REMOTE POE SUBSYSTEM BY FORWARDING PD INPUT VOLTAGE

(71) Applicant: ClearOne, Inc., Salt Lake City, UT (US)

(72) Inventors: Ed Thurmond, Gainesville, FL (US); Richard Herrera, Ft Lauderdale, FL (US); Byra Ferkovich, Gainesville, FL (US); Pichet Ong, West Jordan, UT (US); Peter Manley, Draper, UT (US)

(73) Assignee: ClearOne, Inc., Salt Lake City, UT (US)

( * ) Notice: Subject to any disclaimer, the term of this patent is extended or adjusted under 35 U.S.C. 154(b) by 41 days.

This patent is subject to a terminal disclaimer.

(21) Appl. No.: 16/844,274

(22) Filed: Apr. 9, 2020

(65) Prior Publication Data
US 2020/0233473 A1    Jul. 23, 2020

Related U.S. Application Data

(63) Continuation of application No. 16/305,464, filed as application No. PCT/IB2017/054943 on Aug. 14, 2017, now Pat. No. 10,620,678.

(Continued)

(51) Int. Cl.
*G06F 1/00*    (2006.01)
*G06F 1/26*    (2006.01)
(Continued)

(52) U.S. Cl.
CPC .............. *G06F 1/266* (2013.01); *H01L 24/01* (2013.01); *H01L 29/866* (2013.01); *H04L 12/00* (2013.01);
(Continued)

(58) Field of Classification Search
CPC ...................................................... G06F 1/266
See application file for complete search history.

(56) References Cited

U.S. PATENT DOCUMENTS 7,849,333 B2    12/2010    Schindler
8,873,370 B2    10/2014    Robitaille et al.
(Continued)

FOREIGN PATENT DOCUMENTS

TW          201807979 A1    3/2018
WO    WO2018037309 A1    3/2018

OTHER PUBLICATIONS

Taiwan, "Notice of Substantive Examination Opinion", System for Transmitting Power to a Remote PoE Subsystem by forwarding PD Input Voltage, Manufacturing Method and Non-transitory Program Storage Device Readable by Computering Device Thereof, Taiwan Pat. App. No. 106127785, Nov. 9, 2020, 8.

(Continued)

*Primary Examiner* — Mohammed H Rehman
(74) *Attorney, Agent, or Firm* — Matthew J. Booth PC; Matthew J. Booth (57) ABSTRACT

The present disclosure describes a system 400 for transmitting power to a remote Power over Ethernet (PoE) subsystem by forwarding Powered Device (PD) input voltage where the subsystem includes a PD and a Power Sourcing Equipment (PSE) device. Included is a master PSE device 402, a first subsystem 410, and a second subsystem 428. The first subsystem 410 includes a first PD 418 that includes a first power switching device 426 and a first PSE device 424. The first power switching device 426 forwards the input power from the first PD 418 to the first PSE 424 without disturbing the PoE handshaking between the devices. The first power switching device 426 uses a switching device with level detection that detects the required input voltage. The second subsystem 428 receives the power from the first (Continued)

subsystem's 410 first PSE device 424. And the second subsystem 428 operates in a manner similar to the first subsystem 410.

24 Claims, 4 Drawing Sheets

Related U.S. Application Data (60) Provisional application No. 62/377,731, filed on Aug. 22, 2016.

(51) Int. Cl.
*H01L 23/00* (2006.01)
*H01L 29/866* (2006.01)
*H04L 12/10* (2006.01)
*H04L 12/00* (2006.01)

(52) U.S. Cl.
CPC .... *H04L 12/10* (2013.01); *H01L 2924/13091* (2013.01)

(56) References Cited

U.S. PATENT DOCUMENTS

| | | | |
|---|---|---|---|
| 9,203,628 B2 | 12/2015 | Hunter, Jr. et al. | |
| 9,209,981 B2 | 12/2015 | Heath et al. | |
| 9,531,551 B2 | 12/2016 | Balasubramanian et al. | |
| 9,720,473 B2 | 8/2017 | Chong et al. | |
| 9,847,885 B2 | 12/2017 | Wendt et al. | |
| 10,386,902 B2 | 8/2019 | Chong et al. | |
| 10,620,678 B2 | 4/2020 | Thurmond et al. | |
| 2006/0053324 A1 | 3/2006 | Giat et al. | |
| 2006/0273661 A1 | 12/2006 | Toebes et al. | |
| 2007/0300094 A1 | 12/2007 | Frazier et al. | |
| 2008/0073977 A1 | 3/2008 | Grolnic et al. | |
| 2008/0244284 A1 | 10/2008 | Karam et al. | |
| 2012/0078996 A1 | 3/2012 | Shah | |
| 2012/0198246 A1* | 8/2012 | German | H04Q 1/136 713/300 |
| 2014/0164795 A1 | 6/2014 | Wright et al. | |
| 2014/0372773 A1 | 12/2014 | Heath et al. | |
| 2016/0094410 A1 | 3/2016 | Anwar et al. | |
| 2017/0237580 A1* | 8/2017 | Radermacher | H05B 47/185 307/38 |
| 2017/0324629 A1 | 11/2017 | Iyer et al. | |
| 2019/0278348 A1 | 9/2019 | Thurmond et al. | |
| 2020/0233473 A1 | 7/2020 | Thurmond et al. | |
| 2021/0081018 A1 | 3/2021 | Bazant et al. | |
| 2021/0141432 A1 | 5/2021 | Thurmond et al. | |

OTHER PUBLICATIONS

TIPO, "Notice of Approval of Decision", Taiwan Pat. App. Ser. No. 106127785, Feb. 25, 2021, 6.

* cited by examiner

SYSTEM FOR TRANSMITTING POWER TO A REMOTE POE SUBSYSTEM BY FORWARDING PD INPUT VOLTAGE

CROSS REFERENCE TO RELATED APPLICATIONS

This application claims priority and the benefits of the earlier filed Provisional Application Ser. No. 62/377,731, filed Aug. 22, 2016, which is incorporated by reference for all purposes into this specification.

And this application claims priority and the benefits of the earlier filed International Application Ser. No. PCT/IB2017/054943, filed Aug. 14, 2017, which is incorporated by reference for all purposes into this specification.

And this application is a continuation of the 371 National Stage Application U.S. Ser. No. 16/305,464, with a 371(c) filing date of Aug. 12, 2017, which is incorporated by reference for all purposes into this specification.

TECHNICAL FIELD

This disclosure relates to Power over Ethernet (PoE) technology. More specifically, this disclosure invention relates to transmitting power to a remote Power over Ethernet powered device by forwarding Powered Device input voltage.

BACKGROUND ART

Power over Ethernet (PoE) technology can be used to provide electrical power to multiple electronic devices and/or systems by establishing a PoE power chain. In a typical PoE configuration a Power Sourcing Equipment (PSE) unit is used to source power to a Powered Device (PD) unit. The PSE and the PD units typically reside in separate electronic devices separated by some physical distance and are connected together typically using a RJ-45 type Ethernet cable. The PD provides regulated power to the connected subsystem where the subsystem is located.

The current PoE technology is described in the following patents.

U.S. Pat. No. 9,209,981, entitled: "Power over Ethernet on data pairs and spare pairs" describes a method where a Power over Ethernet Power Sourcing Equipment device is connected to a pair of data wires and a pair of spare wires. When the PSE first powers up if it detects a Powered Device on the data wires it applies power to the data wires via a transistor switch. Next, if it detects a PoE PD device on the spare wires it proceeds to apply PoE power to the spare wires via a second transistor switch. This is a method for a PoE device powering up a PD device directly via a switch. U.S. Pat. No. 9,209,981 is incorporated by reference for all purposes into this specification. In contrast however, one embodiment of the disclosed invention is a method to power a Power Sourcing Equipment device with the output of another Power Sourcing Equipment device.

U.S. Pat. No. 9,203,628, entitled: "Method for apparatus for distributing power over communication cabling", describes in general about allowing Power Sourcing Equipment devices to power up Powered Device devices "directly" based on the presence of a first or second optional load. This reference does not disclose any PSE devices powering other PSE devices. U.S. Pat. No. 9,203,628 is incorporated by reference for all purposes into this specification. Again, in contrast however, one embodiment of the disclosed invention is a method to power a Power Sourcing Equipment device with the output of another Power Sourcing Equipment device.

U.S. Pat. No. 8,873,370, entitled: "Power over Ethernet management devices and connections between Ethernet devices", illustrates multiple embodiments that pass or repeat power from one Ethernet port to another. However, in all embodiments either a Power Sourcing Equipment device is powering a Powered Device or in the embodiment where a Powered Device is powering a Power Sourcing Equipment where there is a 48V power conversion. And, in contrast however, one embodiment of the disclosed invention is a method to power a Power Sourcing Equipment device with the output of another Power Sourcing Equipment device. U.S. Pat. No. 8,873,370 is incorporated by reference for all purposes into this specification.

One or more embodiments of the disclosed invention provide a unique and distinct way for applying input power to a PoE Power Sourcing Equipment device in a subsystem to turn on the PSE. One embodiment includes a feature that include local stepped up subsystem voltages, generated by the Powered Device, which are not used to power up the Power over Ethernet PSE. Instead, the input voltage to the subsystem's PD is used and forwarded to the input of the PoE PSE in a protocol timed manner in order not to interfere with PoE power up handshaking. Embodiments of the disclosed invention have numerous advantages over the prior art that include the following features: cost reduction, power heat dissipation reduction, and power efficiency improvement.

In another embodiment of the disclosed invention, a feature is that a PSE Powered Device powering a PD device is used to power a second PSE device. In the PoE protocol, Power Sourcing Equipment devices are intended to only power PD devices in a point to point topology and are not intended to power directly another Power Sourcing Equipment device in a PoE chain.

And in another embodiment of the disclosed invention, a feature is that the Power Sourcing Equipment output voltage of a first PSE is "forwarded" to the input of a second PSE via an intelligent switch that turns on when the first PSE and a PD connected to the first PSE finalize their power up handshake.

SUMMARY OF INVENTION

The present disclosure describes a system for transmitting power to a remote Power over Ethernet (PoE) subsystem by forwarding Powered Device (PD) input voltage where the subsystem includes a Powered Device and a Power Sourcing Equipment device (PSE). The system includes a Master Source that includes a master Power Sourcing Equipment device, the Master Source provides power to downstream devices through a first Power over Ethernet (PoE) connection using a PoE handshaking protocol; a first subsystem that couples to the Master Source through the first PoE connection, the first subsystem further comprises a first Powered Device that receives power from the Master Source through the first PoE connection, the first Powered Device couples to a first power switching device that further couples and powers a first Power Sourcing Equipment device, the first Powered Device provides power to other components in the first subsystem through subsystem voltages, the first power switching device uses a first switcher regulator that steps up the subsystem voltage to power up the first Power Sourcing Equipment Device, the first power switching device follows a turn on protocol that increases its output power until the first Power Sourcing Equipment Device fully turns on, the first Power Sourcing Equipment Device may forward it's power to a subsequent subsystem in the PoE chain using a second PoE connection without disturbing the PoE handshaking between the first subsystem and subsequent devices; a second subsystem that couples to the first subsystem through the second PoE connection, the second subsystem further comprises a second Powered Device that receives power from the first subsystem through the second PoE connection, the second Powered Device couples to a second power switching device that further couples and powers a second Power Sourcing Equipment device, the second Powered Device provides power to other components in the second subsystem through subsystem voltages, the second power switching device uses a second switcher regulator that steps up the subsystem voltage to power up the second Power Sourcing Equipment Device, the second power switching device follows a turn on protocol that increases its output power until the second Power Sourcing Equipment Device fully turns on, the second Power Sourcing Equipment Device may forward it's power to a subsequent subsystem in the PoE chain using a third PoE connection without disturbing the PoE handshaking between the second subsystem and subsequent devices.

The above embodiment of the invention may include one or more of the following additional embodiments that may be combined in any and all combinations with the above embodiment. One embodiment of the invention describes where the turn on protocol further comprises a Detection Period. One embodiment of the invention describes where the turn on protocol further comprises a Classification Period. One embodiment of the invention describes where the turn on protocol further comprises a Startup Period. One embodiment of the invention describes where the turn on protocol further comprises an Operation Period. One embodiment of the invention describes where the turn on protocol further comprises a Disconnection Period.

The present disclosure further describes an apparatus and method of an embodiment of the invention as further described in this disclosure. Other and further aspects and features of the disclosure will be evident from reading the following detailed description of the embodiments, which should illustrate, not limit, the present disclosure.

BRIEF DESCRIPTION OF DRAWINGS

The drawings accompanying and forming part of this specification are included to depict certain aspects of the disclosure. A clearer impression of the disclosure, and of the components and operation of systems provided with the disclosure, will become more readily apparent by referring to the exemplary, and therefore non-limiting, embodiments illustrated in the drawings, where identical reference numerals designate the same components. Note that the features illustrated in the drawings are not necessarily drawn to scale. The following is a brief description of the accompanying drawings.

DESCRIPTION OF EMBODIMENTS

The disclosed embodiments should describe aspects of the disclosure in sufficient detail to enable a person of ordinary skill in the art to practice the invention. Other embodiments may be utilized, and changes may be made without departing from the disclosure. The following detailed description is not to be taken in a limiting sense, and the present invention is defined only by the included claims.

Specific implementations shown and described are only examples and should not be construed as the only way to implement or partition the present disclosure into functional elements unless specified otherwise in this disclosure. A person of ordinary skill in the art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

In the following description, elements, circuits, and functions may be shown in block diagram form in order not to obscure the present disclosure in unnecessary detail. And block definitions and partitioning of logic between various blocks are exemplary of a specific implementation. It will be readily apparent to a person of ordinary skill in the art that the present disclosure may be practiced by numerous other partitioning solutions. A person of ordinary skill in the art would understand that information and signals may be represented using any of a variety of technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, where the bus may have a variety of bit widths and the present disclosure may be implemented on any number of data signals including a single data signal.

The illustrative functional units include logical blocks, modules, and circuits described in the embodiments disclosed in this disclosure to more particularly emphasize their implementation independence. The functional units may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described in this disclosure. A general-purpose processor may be a microprocessor, any conventional processor, controller, microcontroller, or state machine. A general-purpose processor may be considered a special purpose processor while the general-purpose processor is configured to fetch and execute instructions (e.g., software code) stored on a computer-readable medium such as any type of memory, storage, and/or storage devices. A processor may also be implemented as a combination of computing devices, such as a combination of a DSP and a microprocessor, a plurality of microprocessors, one or more microprocessors in conjunction with a DSP core, or any other such configuration.

In addition, the illustrative functional units described above may include software or programs such as computer readable instructions that may be described in terms of a process that may be depicted as a flowchart, a flow diagram, a structure diagram, or a block diagram. The process may describe operational acts as a sequential process, many acts can be performed in another sequence, in parallel, or substantially concurrently. Further, the order of the acts may be rearranged. In addition, the software may comprise one or more objects, agents, threads, lines of code, subroutines, separate software applications, two or more lines of code or other suitable software structures operating in one or more software applications or on one or more processors. The software may be distributed over several code segments, modules, among different programs, and across several memory devices. Similarly, operational data may be identified and illustrated in this disclosure within modules and may be embodied in any suitable form and organized within any suitable data structure. The operational data may be collected as a single data set or may be distributed over different locations including over different storage devices.

Figure 1:
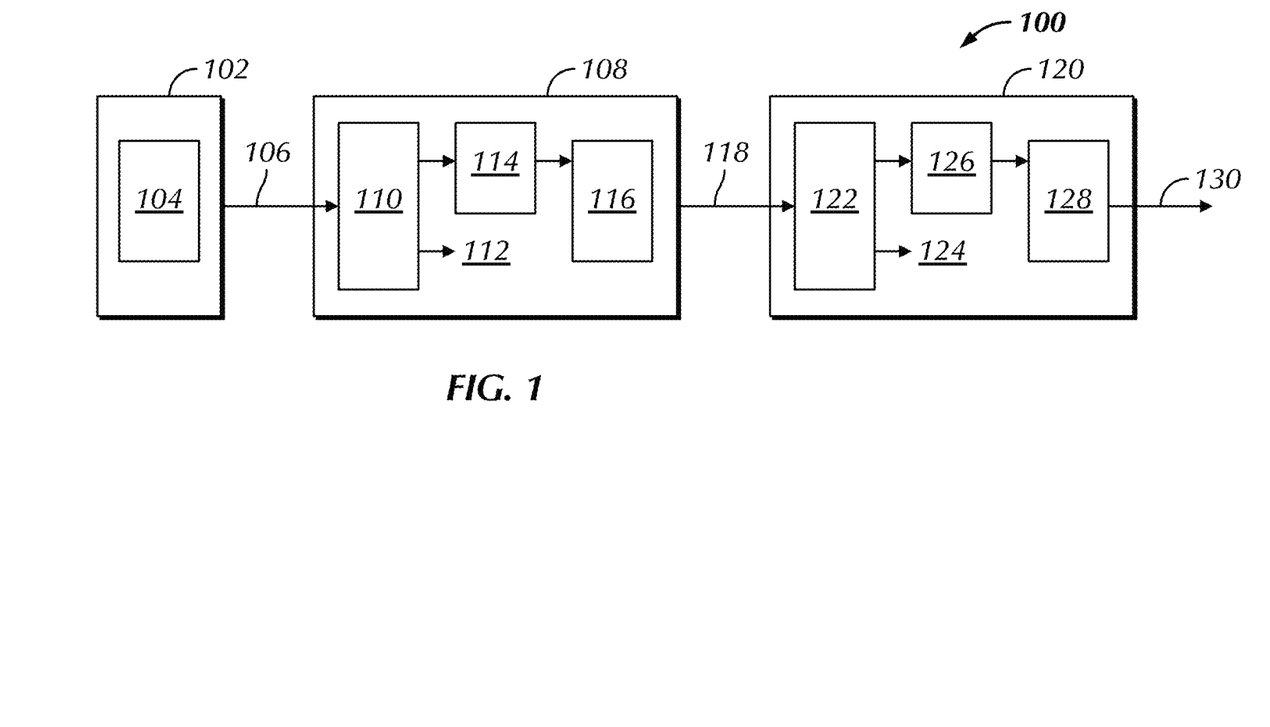
FIG. 1 illustrates the current PoE Technology using a typical PoE power chain.

Elements described in this disclosure may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most discussed. For example, where feasible elements in FIG. 1 are designated with a format of 1xx, where 1 indicates FIG. 1 and xx designates the unique element.

It should be understood that any reference to an element in this disclosure using a designation such as "first," "second," and so forth does not limit the quantity or order of those elements, unless such limitation is explicitly stated. Rather, these designations may be used in this disclosure as a convenient method of distinguishing between two or more elements or instances of an element. A reference to a first and second element does not mean that only two elements may be employed or that the first element must precede the second element. In addition, unless stated otherwise, a set of elements may comprise one or more elements.

Reference throughout this specification to "one embodiment", "an embodiment" or similar language means that a particular feature, structure, or characteristic described in the embodiment is included in at least one embodiment of the present invention. Appearances of the phrases "one embodiment", "an embodiment" and similar language throughout this specification may, but do not necessarily, all refer to the same embodiment.

In the following detailed description, reference is made to the illustrations, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the true scope of the present disclosure. The illustrations in this disclosure are not meant to be actual views of any particular device or system but are merely idealized representations employed to describe embodiments of the present disclosure. And the illustrations presented are not necessarily drawn to scale. And, elements common between drawings may retain the same or have similar numerical designations.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted. The scope of the present disclosure should be determined by the following claims and their legal equivalents.

As used in this disclosure, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus. Furthermore, the term "or" as used in this disclosure is generally intended to mean "and/or" unless otherwise indicated. For example, a condition A or B is satisfied by any one of the following: A is true (or present) and B is false (or not present), A is false (or not present) and B is true (or present), and both A and B are true (or present). As used in this disclosure, a term preceded by "a" or "an" (and "the" when antecedent basis is "a" or "an") includes both singular and plural of such term, unless clearly indicated otherwise (i.e., that the reference "a" or "an" clearly indicates only the singular or only the plural). Also, as used in the description in this disclosure, the meaning of "in" includes "in" and "on" unless the context clearly dictates otherwise.

To aid any Patent Office and any readers of any patent issued on this disclosure in interpreting the included claims, the Applicant(s) wish to note that they do not intend any of the appended claims or claim elements to invoke 35 U.S.C. 112(f) unless the words "means for" or "step for" are explicitly used in the particular claim.

FIG. 1 illustrates a system 100 that uses a typical Power over Ethernet Technology. The system 100 includes a Master source 102 that includes a Master Power Sourcing Equipment (PSE) 104. The Master PSE provides Power over Ethernet (PoE) 106 to other downstream devices typically over twisted pair wires of a standard RJ-45 cable typically used in connecting devices with Ethernet in a local area network system as illustrated in system 100. There are currently several types of standards for PoE such as IEEE 802.3 Alternate A and Alternate B. These standards operate in one of two fashions, either the power is routed onto unused wires in the RJ 45 cable, or the power is routed onto wires used for the data connections. Earlier versions of the PoE 802.3 standard provided up to 15.4 W of DC power (minimum 44V DC and 350 mA) on each port with only 12.95 W of power assured to be available to the device. An updated version of the PoE 802.3 standard provides up to 25.5 W of power. And as of the date of this disclosure, there is discussion of yet another updated PoE 802.3 standard with the ability to provide even more power to downstream devices. The disclosed invention will operate on any current or future versions of the PoE standards or similar type standards.

Returning back to FIG. 1, included in the PoE system 100 is a first subsystem 108 that could be another device such as a hard drive, graphics device, or any other device that connects to the network over Ethernet and may use PoE using a cable such as an RJ-45 cable. The first subsystem 108 may include a Powered Device (PD) 110 such as previously described. The PD 110 may provide power to other components in the subsystem via subsystem voltages 112. The PD 110 additionally may provide power to a switcher regulator 114 that may be used to power an included Power Sourcing Equipment (PSE) 116 device that is part of the first subsystem 108.

The typical PoE system 100 may further include a second subsystem 120 that could be another device such as a hard drive, graphics device, or any other device that connects to the network over Ethernet and may use PoE using a cable such as an RJ 45 cable. The second subsystem 120 receives power from the PSE 116 from the first subsystem 108. The second subsystem 120 may include a Powered Device (PD) 122 such as previously described. The PD 120 may provide power to other components in the subsystem via subsystem voltages 124. The PD 120 additionally may provide power to a switcher regulator 126 that may be used to power an included Power Sourcing Equipment (PSE) 128 device that is part of the first subsystem 108. The PSE 128 may provide PoE 130 to other downstream subsystems that may need or require Power over Ethernet.

Figure 2:
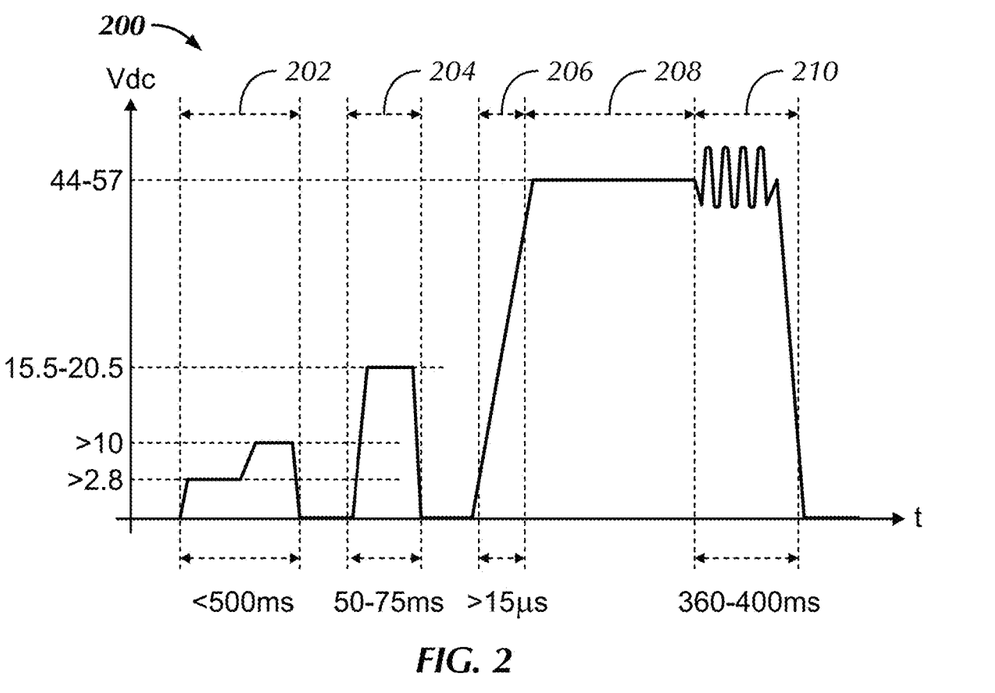
FIG. 2 illustrates a PoE power on handshake.

FIG. 2 illustrates a Power over Ethernet (PoE) power on handshake 200. In a PoE subsystem, a switcher regulator or similar is required to step up the subsystem voltage to a level between 44 to 57 VDC in order to power up the subsystem Power Sourcing Equipment (PSE) device that is used to power up the next Powered Device (PD) in the PoE chain. In order to power a subsystem PSE device with the PD input voltage, it is necessary to create a switching mechanism that does not interfere with the PoE power up handshaking protocol which is implemented via the PoE DC voltage lines. When a PD and PSE are first connected, there is a time period where the PD communicates with the PSE via the voltage lines following a turn on protocol. The PSE gradually increases its output power until it fully turns on at the 44-57 V range. The Detection Period 202 is typically less than 500 ms. The Classification Period 204 is typically between 50 to 75 ms. The Startup Period 206 is typically greater than 15 microseconds. The Operation Period 208 will last as long as the device is in operation and is where the input line voltage coming into the PD is between 44 to 57 V for the currently PoE standards. This input line voltage may go higher with new and/or different standards. Finally, there is the Disconnection Period 210, when the PD is no longer using the PoE and is the time when the output voltage of the subsystem's PSE device goes to 0 V.

There are many issues associated with using a switcher regulator that are typically found in all PoE subsystems, which include the following: the generation of heat in the subsystem card, switching regulator cost, and some loss in power efficiency. Embodiments of the disclosed invention offer a different approach to powering up the downstream subsystem PSE devices by using a transistor switch topology that replaces the switching regulator. This technique has several advantages that include eliminating the buildup of heat as well as improving on cost and power efficiency. Typically, the power losses across a switching regulator can be on the low end of 5 to 10% of the transmitted power, and in some PoE systems in can be higher. Using a power switching technology as disclosed in this invention, the power losses are much less. In addition, the overall loss in a PoE system where all of the subsystems utilize switching regulators, the loss attributed to the regulator can be much higher as its multiplied by the number of subsystems in the overall system. Finally, using transistor technology as disclosed in this invention cost much less than building a switching regulator.

Figure 3:
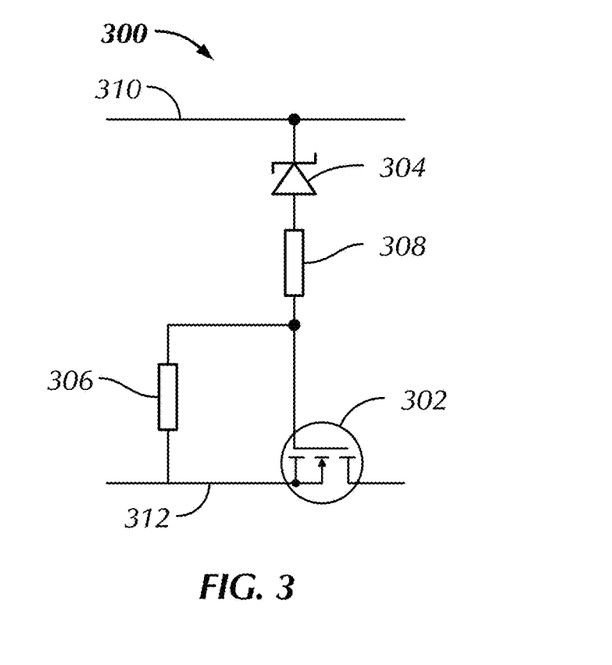
FIG. 3 illustrates an embodiment of a power switching device used in the disclosed invention.

FIG. 3 illustrates one embodiment of the Power over Ethernet (PoE) power switching device 300. In this embodiment of the disclosed invention, a transistor switch with level detection is used to detect when the required 44 to 57 VDC input voltage 310 has been detected. The power switching device in this embodiment is a combination of a FET transistor 302, a 30V Zener diode 304, and two resistors 306 and 308 that connect between the input voltage 310 and ground 312. The components are chosen so that when the threshold voltage has been reached, the power switching device will be biased open. The cathode side of Zener diode 304 is connected to the PoE 44-57 V at the input of the Powered Device (PD). The source of FET 302 is connected to the Power Sourcing Equipment (PSE) device (not shown) ground at the input of the PD (not shown). The drain of FET 302 is connected to the ground of the subsystem PSE. The PoE voltage lines between the master PSE and the PD in the subsystem will reach 44 to 57 VDC after the turn on handshaking protocol between these two devices is completed. At this point, FET 302 will turn on and connect the ground pin of the subsystem's PSE device to the PSE ground of the PD. A person of ordinary skill in the art will understand that other embodiments of switching devices with level detection in PoE environments can be used. For example, the switching device with level detection can use other transistor technologies that include bipolar junction transistors, junction field effect transistors, and isolated gate bipolar transistors or other types of diodes and/or transistors that provide the same functionality. In addition, the switching device with level detection can use other switching technologies that include micro relays, optical switches, and/or other types of switching devices that provide that same functionality.

Figure 4:
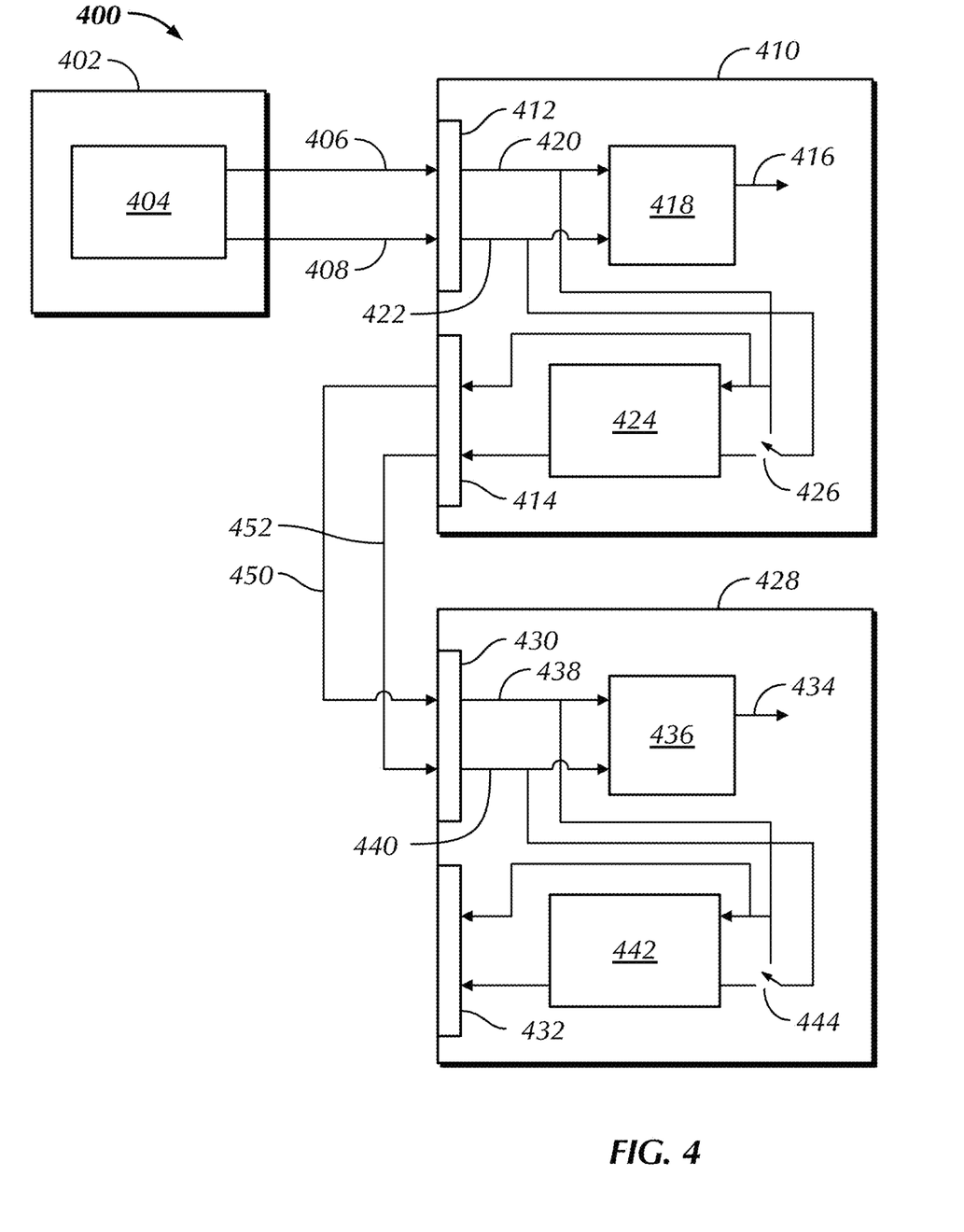
FIG. 4 discloses an embodiment of a PoE system using one embodiment of the power switching technology of the disclosed invention.

FIG. 4 discloses one embodiment of a PoE system that uses the above embodiment of the power switching technology. The system 400 includes a Master source 402 that may include one or more processors, with associated memory and/or storage (not shown separately) to perform one or more functions associated with its purpose and/or the PoE technology. The Master source 402 may include a Master Power Sourcing Equipment (PSE) device 404 component that may also include one or more processors, with associated memory and/or storage (not shown separately) to perform its power functions. The Master PSE 404 provides Power over Ethernet (PoE) with power 406 and ground 408 to other downstream devices typically over the twisted pair wires of a standard RJ-45 cable typically used in connecting devices with Ethernet in a local area network system as illustrated in system 400.

Returning back to FIG. 4, included in the PoE system 400 is a first subsystem 410 that could be another device such as a hard drive, graphics device, or any other device that connects to the network over Ethernet and may use PoE using a cable such as an RJ 45 cable. The first subsystem 410 may include one or more processors, with associated memory and/or storage (not shown separately) to perform one or more functions associated with its purpose. The first subsystem 410 may include a Powered Device (PD) 418 such as previously described. In addition, the PD 418 may include one or more processors, with associated memory and/or storage (not shown separately) to perform one or more functions associated with its purpose. The PD 418 receives power 420 and ground 422 through connector 412 that connects subsystem 410 to the Master source 402. The PD 418 may provide power to other components in the subsystem via subsystem voltages 416. The PD 418 additionally may provide power to a Power Sourcing Equipment device (PSE) 424 that is part of the first subsystem 410. The PSE 424 may include one or more processors, with associated memory and/or storage (not shown separately) to perform one or more functions associated with its purpose.

This embodiment of the disclosed invention uses the power switching device 300 as illustrated in FIG. 3. In FIG. 4, the power switching device 426 is external to PD 418 and PSE 424. The input of the power switching device 426 is connected internally to the PoE 44-57 V input voltage 420 at the input of the PD 418. The source of the FET for the power switching device 426 is connected to PSE device 424 ground at the input of the PD 418. The drain of the FET in the power switching device 426 is connected to the ground of the subsystem PSE device 424. The PoE voltage lines between the master PSE 404 and the PD 418 in the first subsystem 410 will reach 44 to 57 VDC after the turn on handshaking protocol between these two devices is completed. At this point, the FET in the power switching device 426 will turn on and connect the PSE ground pin of the first subsystem's PSE 424 to the PSE ground of the PD 418. The power switching device 426 allows the PSE 424 to be turned on without the need of having to step up the subsystem voltages such as when using a switching regulator in a typical PoE system. The power switching device 426 reuses or "forwards" the 44 to 57 VDC input voltage 420 at the first subsystem's PD 418 to the subsystem's PSE device 424 without disturbing the PoE handshaking protocol between the PSE's and the PD's.

The first subsystem 410 provides Power over Ethernet (PoE) with power 450 and ground 452 to other downstream devices such as a second subsystem 428. When PSE device 424 in subsystem 410 turns on, the PoE power will be available from subsystem 410 to turn subsystem 428 on. PSE device 424 in subsystem 410 will turn on the PD 436 in subsystem 428 by following the PoE handshaking protocol. The second subsystem 428 could be another device such as a hard drive, graphics device, or any other device that connects to the network over Ethernet and may use PoE using a cable such as an RJ 45 cable. The second subsystem 428 may include one or more processors, with associated memory and/or storage (not shown separately) to perform one or more functions associated with its purpose. The second subsystem 428 may include a Powered Device (PD) 436 such as previously described. In addition, the PD 436 may include one or more processors, with associated memory and/or storage (not shown separately) to perform one or more functions associated with its purpose. The PD 436 receives power 438 and ground 440 through connector 430 that connects the second subsystem 428 to the first subsystem 410. The PD 436 may provide power to other components in the subsystem via subsystem voltages 434. The PD 436 additionally may provide power to a PSE device 442 that is part of the second subsystem 428. The PSE device 442 may include one or more processors, with associated memory and/or storage (not shown separately) to perform one or more functions associated with its purpose. The power switching device 444 operates in a manner similar to the power switching device 426 as previously described. Finally, the second subsystem 428 may provide a PoE connection to another subsystem through connector 432 that transmits power 438 and ground 430 to the downstream subsystem. As previously described, PSE device 442 in subsystem 428 turns on, the PoE power will be available from subsystem 428 to turn a downstream subsystem on. PSE device 442 in subsystem 428 will turn on the downstream PD in the downstream subsystem by following the PoE handshaking protocol.

Another embodiment of the disclosed invention includes using an intelligent power switching device to control the transistor switch. In this embodiment, power switching device 426 and power switching device 444 would include one or more processors, with associated memory and/or storage (not shown separately) to perform one or more functions associated with its purpose. This embodiment provides that the appropriate subsystem 410 and subsystem 428 could control and monitor the power directly and even allow the power to be monitored and controlled by other devices throughout the network. An advantage to using an intelligent power switching device is that this allows one or more devices in the network to report whether subsequent devices added to the PoE chain will have sufficient power through the PoE connection to support them.

A further advantage to an intelligent power switching device is that it would allow upstream PoE devices to turn off, power down, or cycle down some functionality in order to reduce power consumption to allow for additional downstream devices to connect to the PoE chain. If there is not sufficient power for the downstream devices, then the upstream devices (or other devices on the network) can be notified that there is not sufficient power for additional devices in this PoE chain.

Another embodiment of the disclosed invention provides that a local power source such as a battery can be attached to or included with PSE devices 424 and/or 442. A local power source attached to a PSE can be used to allow downstream devices to connect to the system. In addition, a mid-span PoE power supply can be added in to the PoE chain so that it can be extended with additional downstream devices.

Figure 5:
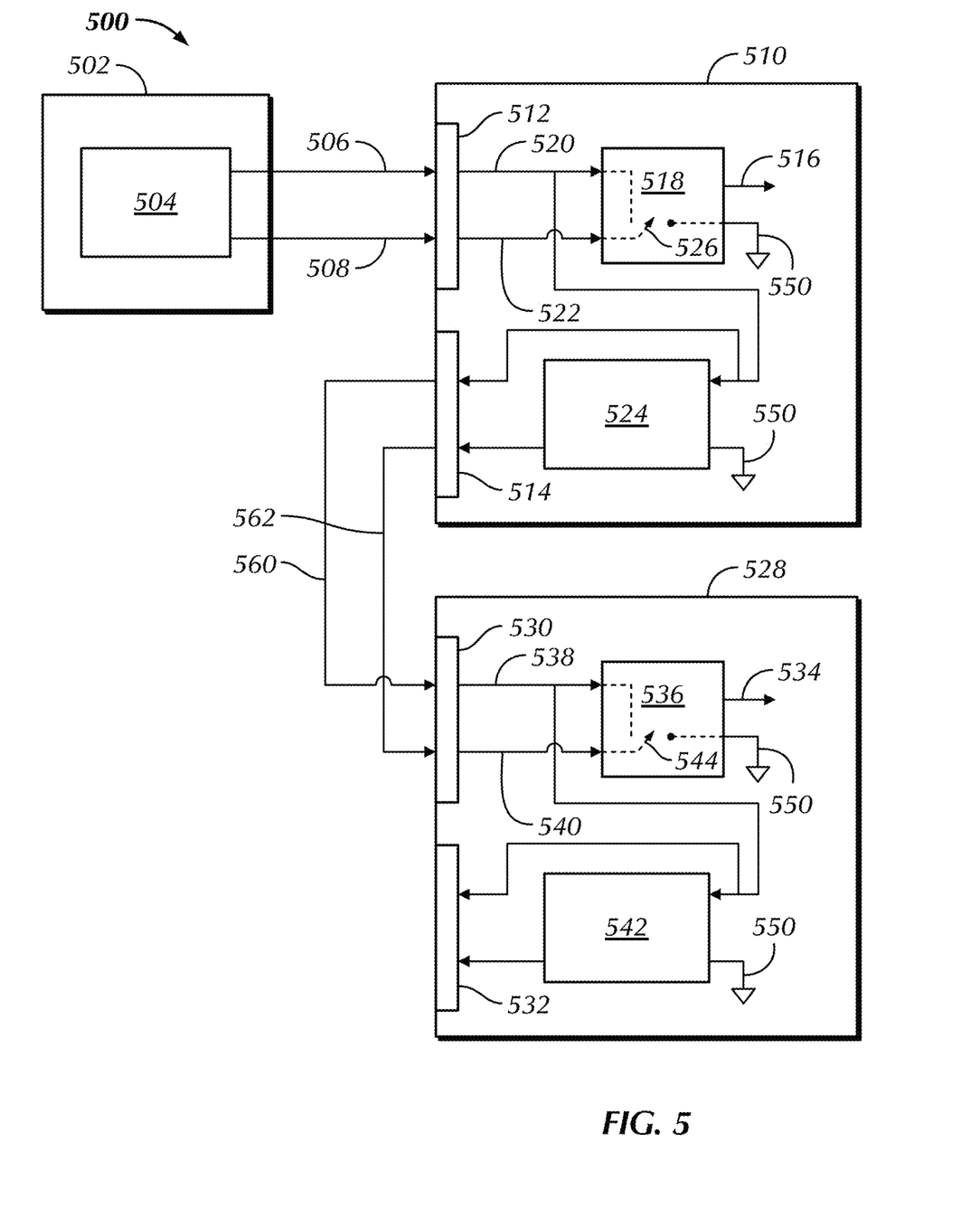
FIG. 5 discloses another embodiment of a PoE system with another embodiment of the power switching technology of the disclosed invention.

FIG. 5 discloses another embodiment of a PoE system that uses a different embodiment for the power switching technology. The system 500 includes a Master source 502 that may include one or more processors, with associated memory and/or storage (not shown separately) to perform one or more functions associated with its purpose and/or the PoE technology. The Master source 502 may include a Master Power Sourcing Equipment (PSE) device 504 component that may also include one or more processors, with associated memory and/or storage (not shown separately) to perform its power functions. The Master PSE 504 provides Power over Ethernet (PoE) with power 506 and ground 508 to other downstream devices typically over the twisted pair wires of a standard RJ-45 cable typically used in connecting devices with Ethernet in a local area network system as illustrated in system 500.

Returning back to FIG. 5, included in the PoE system 500 is a first subsystem 510 that could be another device such as a hard drive, graphics device, or any other device that connects to the network over Ethernet and may use PoE using a cable such as an RJ 45 cable. The first subsystem 510 may include one or more processors, with associated memory and/or storage (not shown separately) to perform one or more functions associated with its purpose. The first subsystem 510 may include a Powered Device (PD) 518 such as previously described. In addition, the PD 518 may include one or more processors, with associated memory and/or storage (not shown separately) to perform one or more functions associated with its purpose. The PD 518 receives power 520 and ground 522 through connector 512 that connects subsystem 510 to the Master source 502. The PD 518 may provide power to other components in the subsystem via subsystem voltages 516. The PD 518 additionally may provide power to a Power Sourcing Equipment device (PSE) 524 that is part of the first subsystem 510. The PSE 524 may include one or more processors, with associated memory and/or storage (not shown separately) to perform one or more functions associated with its purpose. Connected to PD 518 and PSE 524 is ground 550.

The first subsystem 510 provides PoE with power 560 and ground 562 to other downstream devices such as subsystem 528. When PSE 524 in subsystem 510 turns on, the PoE power will be available from subsystem 510 to turn subsystem 528 on. PSE 524 in subsystem 510 will turn on the PD 536 in subsystem 528 by following the PoE handshaking protocol. The second subsystem 528 could be another device such as a hard drive, graphics device, or any other device that connects to the network over Ethernet and may use PoE using a cable such as an RJ 45 cable. The second subsystem 528 may include one or more processors, with associated memory and/or storage (not shown separately) to perform one or more functions associated with its purpose. The second subsystem 528 may include a Powered Device (PD) 536 such as previously described. In addition, the PD 536 may include one or more processors, with associated memory and/or storage (not shown separately) to perform one or more functions associated with its purpose. The PD 536 receives power 538 and ground 540 through connector 530 that connects second subsystem 528 to the first subsystem 510. The PD 536 may provide power to other components in the subsystem via subsystem voltages 534. The PD 536 additionally may provide power to a Power Sourcing Equipment device (PSE) 542 that is part of the second subsystem 528. The PSE 542 may include one or more processors, with associated memory and/or storage (not shown separately) to perform one or more functions associated with its purpose. Finally, the second subsystem 528 may provide a PoE connection to another subsystem through connector 532 that transmits power 538 and ground 540 to the downstream subsystem. As previously described, PSE 542 in subsystem 528 turns on, the PoE power will be available from subsystem 528 to turn a downstream subsystem on. PSE 542 in subsystem 528 will turn on the downstream PD in the downstream subsystem by following the PoE handshaking protocol. Connected to PD 536 and PSE 542 is ground 550.

In contrast to the embodiment illustrated in FIG. 4 that uses an external power switching device, this embodiment of the disclosed invention uses a built-in digital circuit of the PD to provide the powered switching device. For example, PD 518 and/or 536 may contain a digital circuit that has one or more MOSFET's suitable for switching power in a PoE system. When the input voltage 520 rises above the on-voltage threshold for the PoE technology (such as 44-57 VDC), PD 518 connects the input PSE device 524 to ground pin via power switching device 526, and likewise PD 536 connects the input PSE device 542 to ground pin via power switching device 544.

The PoE voltage lines between the master PSE device 504 and the PD 518 in the first subsystem 510 will reach 44 to 57 VDC after the turn on handshaking protocol between these two devices is completed. The power switching device 526 allows the PSE device 524 to be turned on without the need of having to step up the subsystem voltages such as when using a switching regulator in a typical PoE system. The power switching device 526 reuses or "forwards" the 44 to 57 VDC input voltage 520 at the first subsystem's PD 518 to the subsystem's PSE 524 without disturbing the PoE handshaking protocol between the PSE's and the PD's. The power switching device 544 operates in a manner similar to the power switching device 526 as previously described.

Another embodiment of the disclosed invention includes using an intelligent power switching device to control the transistor switch. In this embodiment, power switching device 526 and power switching device 542 would be controlled by a processor in PD 518 and a processor in PDF 536 respectively. The use of an intelligent power switching device in this embodiment provides the same features and benefits as previously describe.

Another embodiment of the disclosed invention provides that a local power source such as a battery can be attached or included with PSE devices 524 and/or 542 with all of the same features and benefits as previously described. As before, a mid-span PoE power supply can be added in to the PoE chain so that it can be extended with additional downstream devices.

While the present disclosure has been described herein with respect to certain illustrated and described embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor. The disclosure of the present invention is exemplary only, with the true scope of the present invention being determined by the included claims.

The invention claimed is:

1. A system for transmitting power to a remote Power over Ethernet (PoE) subsystem by forwarding Powered Device (PD) input voltage where the subsystem includes a Powered Device and a Power Sourcing Equipment device (PSE), comprising:
 a Master Source that includes a master Power Sourcing Equipment device, the Master Source provides power to downstream devices through a first Power over Ethernet (PoE) connection using a PoE handshaking protocol;
 a first subsystem that couples to the Master Source through the first PoE connection, the first subsystem further comprises a first Powered Device that receives power from the Master Source through the first PoE connection, the first Powered Device couples to a first power switching device that further couples and powers a first Power Sourcing Equipment device, the first Powered Device provides power to other components in the first subsystem through subsystem voltages, the first power switching device uses a first switcher regulator that steps up the subsystem voltage to power up the first Power Sourcing Equipment Device, the first power switching device follows a turn on protocol that increases its output power until the first Power Sourcing Equipment Device fully turns on, the first Power Sourcing Equipment Device may forward it's power to a subsequent subsystem in the PoE chain using a second PoE connection without disturbing the PoE handshaking between the first subsystem and subsequent devices;

a second subsystem that couples to the first subsystem through the second PoE connection, the second subsystem further comprises a second Powered Device that receives power from the first subsystem through the second PoE connection, the second Powered Device couples to a second power switching device that further couples and powers a second Power Sourcing Equipment device, the second Powered Device provides power to other components in the second subsystem through subsystem voltages, the second power switching device uses a second switcher regulator that steps up the subsystem voltage to power up the second Power Sourcing Equipment Device, the second power switching device follows a turn on protocol that increases its output power until the second Power Sourcing Equipment Device fully turns on, the second Power Sourcing Equipment Device may forward it's power to a subsequent subsystem in the PoE chain using a third PoE connection without disturbing the PoE handshaking between the second subsystem and subsequent devices.

2. The claim according to claim 1 where the turn on protocol further comprises a Detection Period.

3. The claim according to claim 1 where the turn on protocol further comprises a Classification Period.

4. The claim according to claim 1 where the turn on protocol further comprises a Startup Period.

5. The claim according to claim 1 where the turn on protocol further comprises an Operation Period.

6. The claim according to claim 1 where the turn on protocol further comprises a Disconnection Period.

7. A method for manufacturing a system for transmitting power to a remote Power over Ethernet (PoE) subsystem by forwarding Powered Device (PD) input voltage where the subsystem includes a Powered Device and a Power Sourcing Equipment device (PSE), comprising:

providing a Master Source that includes a master Power Sourcing Equipment device, the Master Source provides power to downstream devices through a first Power over Ethernet (PoE) connection using a PoE handshaking protocol;

coupling a first subsystem to the Master Source through the first PoE connection, the first subsystem further comprises a first Powered Device that receives power from the Master Source through the first PoE connection, the first Powered Device couples to a first power switching device that further couples and powers a first Power Sourcing Equipment device, the first Powered Device provides power to other components in the first subsystem through subsystem voltages, the first power switching device uses a first switcher regulator that steps up the subsystem voltage to power up the first Power Sourcing Equipment Device, the first power switching device follows a turn on protocol that increases its output power until the first Power Sourcing Equipment Device fully turns on, the first Power Sourcing Equipment Device may forward it's power to a subsequent subsystem in the PoE chain using a second PoE connection without disturbing the PoE handshaking between the first subsystem and subsequent devices;

coupling a second subsystem to the first subsystem through the second PoE connection, the second subsystem further comprises a second Powered Device that receives power from the first subsystem through the second PoE connection, the second Powered Device couples to a second power switching device that further couples and powers a second Power Sourcing Equipment device, the second Powered Device provides power to other components in the second subsystem through subsystem voltages, the second power switching device uses a second switcher regulator that steps up the subsystem voltage to power up the second Power Sourcing Equipment Device, the second power switching device follows a turn on protocol that increases its output power until the second Power Sourcing Equipment Device fully turns on, the second Power Sourcing Equipment Device may forward it's power to a subsequent subsystem in the PoE chain using a third PoE connection without disturbing the PoE handshaking between the second subsystem and subsequent devices.

8. The claim according to claim 7 where the turn on protocol further comprises a Detection Period.

9. The claim according to claim 7 where the turn on protocol further comprises a Classification Period.

10. The claim according to claim 7 where the turn on protocol further comprises a Startup Period.

11. The claim according to claim 7 where the turn on protocol further comprises an Operation Period.

12. The claim according to claim 7 where the turn on protocol further comprises a Disconnection Period.

13. A method for using a system for transmitting power to a remote Power over Ethernet (PoE) subsystem by forwarding Powered Device (PD) input voltage where the subsystem includes a Powered Device and a Power Sourcing Equipment device (PSE), comprising:

providing a Master Source that includes a master Power Sourcing Equipment device, the Master Source provides power to downstream devices through a first Power over Ethernet (PoE) connection using a PoE handshaking protocol;

receiving power to a first subsystem that couples to the Master Source through the first PoE connection, the first subsystem further comprises a first Powered Device that receives power from the Master Source through the first PoE connection, the first Powered Device couples to a first power switching device that further couples and powers a first Power Sourcing Equipment device, the first Powered Device provides power to other components in the first subsystem through subsystem voltages, the first power switching device uses a first switcher regulator that steps up the subsystem voltage to power up the first Power Sourcing Equipment Device, the first power switching device follows a turn on protocol that increases its output power until the first Power Sourcing Equipment Device fully turns on, the first Power Sourcing Equipment Device may forward it's power to a subsequent subsystem in the PoE chain using a second PoE connection without disturbing the PoE handshaking between the first subsystem and subsequent devices;

receiving power to a second subsystem that couples to the first subsystem through the second PoE connection, the second subsystem further comprises a second Powered Device that receives power from the first subsystem through the second PoE connection, the second Powered Device couples to a second power switching device that further couples and powers a second Power Sourcing Equipment device, the second Powered Device provides power to other components in the second subsystem through subsystem voltages, the second power switching device uses a second switcher regulator that steps up the subsystem voltage to power up the second Power Sourcing Equipment Device, the second power switching device follows a turn on protocol that increases its output power until the second Power Sourcing Equipment Device fully turns on, the second Power Sourcing Equipment Device may forward it's power to a subsequent subsystem in the PoE chain using a third PoE connection without disturbing the PoE handshaking between the second subsystem and subsequent devices.

14. The claim according to claim 13 where the turn on protocol further comprises a Detection Period.

15. The claim according to claim 13 where the turn on protocol further comprises a Classification Period.

16. The claim according to claim 13 where the turn on protocol further comprises a Startup Period.

17. The claim according to claim 13 where the turn on protocol further comprises an Operation Period.

18. The claim according to claim 13 where the turn on protocol further comprises a Disconnection Period.

19. A non-transitory program storage device readable by a computing device that tangibly embodies a program of instructions executable by the computing device to perform a method to use a system for transmitting power to a remote Power over Ethernet (PoE) subsystem by forwarding Powered Device (PD) input voltage where the subsystem includes a Powered Device and a Power Sourcing Equipment device (PSE), comprising:

providing a Master Source that includes a master Power Sourcing Equipment device, the Master Source provides power to downstream devices through a first Power over Ethernet (PoE) connection using a PoE handshaking protocol;

coupling a first subsystem to the Master Source through the first PoE connection, the first subsystem further comprises a first Powered Device that receives power from the Master Source through the first PoE connection, the first Powered Device couples to a first power switching device that further couples and powers a first Power Sourcing Equipment device, the first Powered Device provides power to other components in the first subsystem through subsystem voltages, the first power switching device uses a first switcher regulator that steps up the subsystem voltage to power up the first Power Sourcing Equipment Device, the first power switching device follows a turn on protocol that increases its output power until the first Power Sourcing Equipment Device fully turns on, the first Power Sourcing Equipment Device may forward it's power to a subsequent subsystem in the PoE chain using a second PoE connection without disturbing the PoE handshaking between the first subsystem and subsequent devices;

coupling a second subsystem to the first subsystem through the second PoE connection, the second subsystem further comprises a second Powered Device that receives power from the first subsystem through the second PoE connection, the second Powered Device couples to a second power switching device that further couples and powers a second Power Sourcing Equipment device, the second Powered Device provides power to other components in the second subsystem through subsystem voltages, the second power switching device uses a second switcher regulator that steps up the subsystem voltage to power up the second Power Sourcing Equipment Device, the second power switching device follows a turn on protocol that increases its output power until the second Power Sourcing Equipment Device fully turns on, the second Power Sourcing Equipment Device may forward it's power to a subsequent subsystem in the PoE chain using a third PoE connection without disturbing the PoE handshaking between the second subsystem and subsequent devices.

20. The claim according to claim 19 where the turn on protocol further comprises a Detection Period.

21. The claim according to claim 19 where the turn on protocol further comprises a Classification Period.

22. The claim according to claim 19 where the turn on protocol further comprises a Startup Period.

23. The claim according to claim 19 where the turn on protocol further comprises an Operation Period.

24. The claim according to claim 19 where the turn on protocol further comprises a Disconnection Period.

* * * * *

UNITED STATES PATENT AND TRADEMARK OFFICE
CERTIFICATE OF CORRECTION

Page 1 of 1

PATENT NO. : 11,188,133 B2
APPLICATION NO. : 16/844274
DATED : November 30, 2021
INVENTOR(S) : Ed Thurmond et al.

It is certified that error appears in the above-identified patent and that said Letters Patent is hereby corrected as shown below:

In the Specification

In Column 1, Line 19, delete "Aug. 12, 2017," and insert -- Aug. 14, 2017, --, therefor.

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*